United States Patent
Sanchez et al.

(10) Patent No.: US 9,171,718 B2
(45) Date of Patent: *Oct. 27, 2015

(54) METHOD OF EPITAXIAL GERMANIUM TIN ALLOY SURFACE PREPARATION

(71) Applicant: Applied Materials, Inc., Santa Clara, CA (US)

(72) Inventors: Errol Antonio C. Sanchez, Tracy, CA (US); Yi-Chiau Huang, Fremont, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/175,527

(22) Filed: Feb. 7, 2014

(65) Prior Publication Data
US 2014/0154875 A1 Jun. 5, 2014

Related U.S. Application Data

(63) Continuation of application No. 13/456,500, filed on Apr. 26, 2012, now Pat. No. 8,647,439.

(51) Int. Cl.
*H01L 21/02* (2006.01)
*H01L 21/3065* (2006.01)

(52) U.S. Cl.
CPC ...... *H01L 21/02661* (2013.01); *H01L 21/0245* (2013.01); *H01L 21/0262* (2013.01); *H01L 21/02452* (2013.01); *H01L 21/02532* (2013.01); *H01L 21/02535* (2013.01); *H01L 21/02576* (2013.01); *H01L 21/02579* (2013.01); *H01L 21/3065* (2013.01)

(58) Field of Classification Search
None
See application file for complete search history.

(56) References Cited

U.S. PATENT DOCUMENTS

| | | | |
|---|---|---|---|
| 4,766,093 | A | 8/1988 | Hovel et al. |
| 4,769,341 | A | 9/1988 | Luryi |
| 5,548,128 | A | 8/1996 | Soref et al. |
| 6,037,614 | A | 3/2000 | He et al. |
| 7,316,947 | B2 | 1/2008 | Yamazaki et al. |
| 7,435,301 | B2 | 10/2008 | Mun et al. |

(Continued)

FOREIGN PATENT DOCUMENTS

| | | |
|---|---|---|
| JP | 2001-168029 A | 6/2001 |
| KR | 2007-0035362 A | 3/2007 |

OTHER PUBLICATIONS

International Search report for PCT/US2013/036534 dated Jul. 1, 2013.

Primary Examiner — Allan Olsen
(74) Attorney, Agent, or Firm — Patterson & Sheridan, LLP

(57) ABSTRACT

Methods of preparing a clean surface of germanium tin or silicon germanium tin layers for subsequent deposition are provided. An overlayer of Ge, doped Ge, another GeSn or SiGeSn layer, a doped GeSn or SiGeSn layer, an insulator, or a metal can be deposited on a prepared GeSn or SiGeSn layer by positioning a substrate with an exposed germanium tin or silicon germanium tin layer in a processing chamber, heating the processing chamber and flowing a halide gas into the processing chamber to etch the surface of the substrate using either thermal or plasma assisted etching followed by depositing an overlayer on the substantially oxide free and contaminant free surface. Methods can also include the placement and etching of a sacrificial layer, a thermal clean using rapid thermal annealing, or a process in a plasma of nitrogen trifluoride and ammonia gas.

13 Claims, 4 Drawing Sheets

(56) References Cited

U.S. PATENT DOCUMENTS

| | | |
|---|---|---|
| 7,582,891 B2 | 9/2009 | Kouvetakis et al. |
| 7,589,003 B2 | 9/2009 | Kouvetakis et al. |
| 7,596,158 B2 | 9/2009 | Liu et al. |
| 7,598,513 B2 | 10/2009 | Kouvetakis et al. |
| 7,603,016 B1 | 10/2009 | Soref |
| 7,907,848 B1 | 3/2011 | Soref |
| 7,915,104 B1 | 3/2011 | Kouvetakis et al. |
| 8,029,905 B2 | 10/2011 | Kouvetakis et al. |
| 8,138,105 B2 | 3/2012 | Timans |
| 8,138,560 B2 | 3/2012 | Yamaguchi et al. |
| 8,647,439 B2 | 2/2014 | Sanchez et al. |
| 2002/0025661 A1* | 2/2002 | Nikolaev et al. ............ 438/505 |
| 2003/0010980 A1 | 1/2003 | Yamazaki et al. |
| 2003/0024390 A1* | 2/2003 | Funke et al. ................ 95/143 |
| 2005/0070053 A1 | 3/2005 | Sadaka et al. |
| 2005/0070056 A1 | 3/2005 | Liu et al. |
| 2005/0070057 A1 | 3/2005 | Liu et al. |
| 2005/0072988 A1 | 4/2005 | Augusto |
| 2006/0134895 A1 | 6/2006 | Kouvetakis et al. |
| 2007/0020891 A1 | 1/2007 | Kouvetakis et al. |
| 2008/0014733 A1 | 1/2008 | Liu |
| 2008/0187768 A1 | 8/2008 | Kouvetakis et al. |
| 2009/0111246 A1* | 4/2009 | Bauer et al. .................. 438/478 |
| 2009/0117676 A1* | 5/2009 | Katsuyama ................... 438/24 |
| 2010/0013053 A1* | 1/2010 | Nakayama et al. ........... 257/615 |
| 2010/0108979 A1 | 5/2010 | Lee |
| 2010/0244107 A1 | 9/2010 | Kronholz et al. |
| 2010/0282305 A1 | 11/2010 | Sharps et al. |
| 2010/0282306 A1 | 11/2010 | Sharps et al. |
| 2010/0282307 A1 | 11/2010 | Sharps et al. |
| 2010/0290015 A1* | 11/2010 | Banine et al. .................. 355/30 |
| 2011/0065281 A1 | 3/2011 | Gao et al. |
| 2011/0117732 A1 | 5/2011 | Bauer et al. |
| 2011/0210328 A1 | 9/2011 | Yamazaki et al. |
| 2012/0025212 A1 | 2/2012 | Kouvetakis et al. |
| 2012/0077335 A1* | 3/2012 | Sanchez et al. ............... 438/478 |
| 2012/0186641 A1 | 7/2012 | Sharps et al. |
| 2012/0295417 A1 | 11/2012 | Adam et al. |
| 2012/0306054 A1* | 12/2012 | Huang et al. .................. 257/616 |
| 2012/0306055 A1* | 12/2012 | Huang et al. .................. 257/616 |
| 2013/0164918 A1 | 6/2013 | Liang et al. |
| 2013/0183814 A1 | 7/2013 | Huang et al. |
| 2013/0183815 A1* | 7/2013 | Sanchez et al. ............... 438/478 |
| 2013/0210221 A1* | 8/2013 | Huang et al. .................. 438/509 |
| 2013/0240478 A1* | 9/2013 | Sanchez et al. ............... 216/37 |
| 2014/0020619 A1* | 1/2014 | Vincent et al. ................ 117/88 |

* cited by examiner

METHOD OF EPITAXIAL GERMANIUM TIN ALLOY SURFACE PREPARATION

CROSS-REFERENCE TO RELATED APPLICATIONS

This application claims benefit of U.S. Nonprovisional patent application Ser. No. 13/456,500 (APPM/16989US), filed Apr. 26, 2012, which is herein incorporated by reference.

BACKGROUND OF THE INVENTION

1. Field of the Invention

Technology described herein relates to the surface preparation of germanium tin (GeSn) or silicon germanium tin (SiGeSn) layers for subsequent deposition.

2. Description of the Related Art

Germanium was one of the first materials used for semiconductor applications such as CMOS transistors. Due to vast abundance of silicon compared to germanium, however, silicon has been the overwhelming semiconductor material of choice for CMOS manufacture. As device geometries decline according to Moore's Law, the size of transistor components poses challenges to engineers working to make devices that are smaller, faster, use less power, and generate less heat. For example, as the size of a transistor declines, the channel region of the transistor becomes smaller, and the electronic properties of the channel become less viable, with more resistivity and higher threshold voltages.

Carrier mobility is increased in the silicon channel area by using silicon-germanium stressors embedded in the source/drain areas, which enhances the intrinsic mobility of silicon. For future nodes, however, still higher mobility devices are needed.

Switching to higher mobility materials than silicon, such as germanium for pMOSFETs, has been suggested. However, the mobility of germanium is not superior to strained silicon, unless the germanium is also strained. It has been recently discovered that germanium tin (GeSn) grown on the source drain region has the requisite strain for making a superior germanium pMOSFET channel, which takes advantage of the germanium/GeSn lattice mismatch. GeSn and silicon germanium tin (SiGeSn) also have mobilities still higher than Ge so they can potentially be used in channel applications by themselves.

However, during the formation and subsequent treatment of the GeSn layer, the surface can become oxidized or affected by other impurities, affecting the subsequent deposition of any overlayer. The overlayer materials can include Ge, doped Ge, a GeSn layer, a SiGeSn layer, a doped GeSn layer, a doped SiGeSn layer, an insulator, or a metal. Unlike silicon surfaces, germanium surfaces are not effectively passivated by oxide formation. The formation of unstable germanium oxides under atmospheric conditions lead to point defects in the surface which can lead to defects in subsequently deposited layers. Thus, there is a need for methods of preparing the surface of GeSn or SiGeSn for subsequent overlayer deposition.

SUMMARY OF THE INVENTION

Methods for preparing the surface of germanium tin (GeSn) or silicon germanium tin (SiGeSn) layers for subsequent deposition are provided. In one or more embodiments, a layer of Ge, doped Ge, a GeSn layer, a SiGeSn layer, a doped GeSn layer, a doped SiGeSn layer, an insulator, or a metal can be deposited on a prepared GeSn or SiGeSn layer by positioning a substrate with an exposed GeSn or SiGeSn layer in a processing chamber, heating the processing chamber to a first temperature, flowing an etching gas, such as a halide gas, into the processing chamber at the first temperature, etching the surface of the substrate at the first temperature using either thermal etching or plasma assisted etching, depositing an overlayer on top of the cleaned surface, where the overlayer can include Ge, doped Ge, a GeSn layer, a SiGeSn layer, a doped GeSn layer, a doped SiGeSn layer, an insulator, or a metal.

In one or more embodiments, a method of preparing the surface of germanium tin (GeSn) or silicon germanium tin (SiGeSn) layers can include depositing a sacrificial protective cap germanium layer, which can be from 20 Å to 40 Å thick, on the surface of the GeSn or SiGeSn layer, where the germanium layer is deposited after GeSn or SiGeSn layer formation and before the wafer transfers out of the processing chamber, transferring the wafer to a second processing chamber in which further deposition is to be performed, heating the second processing chamber to a first temperature, flowing a halide gas into the second processing chamber at the first temperature, etching the surface of the substrate at the first temperature using either thermal etching or plasma assisted etching to remove the sacrificial germanium layer and expose the clean GeSn or SiGeSn surface, prior to depositing another layer on top of the cleaned surface, where the overlayer can include Ge, doped Ge, a GeSn layer, a SiGeSn layer, a doped GeSn layer, a doped SiGeSn layer, an insulator, or a metal.

In another embodiment, a method of preparing the surface of germanium tin (GeSn) or silicon germanium tin (SiGeSn) layers can include positioning a substrate with an exposed GeSn or SiGeSn layer in a processing chamber, flowing $H_2$ into the chamber while maintaining a constant pressure, heating the chamber to a first temperature while maintaining the flow of $H_2$, wherein the temperature can be higher than 450° C. and can be maintained for a short period of time, stopping the flow of $H_2$ into the chamber, cooling the chamber to a second temperature which can be below 400° C., prior to depositing another layer on top of the cleaned GeSn or SiGeSn surface, where the overlayer can include Ge, doped Ge, a GeSn layer, a SiGeSn layer, a doped GeSn layer, a doped SiGeSn layer, an insulator, or a metal.

In a further embodiment, a method of preparing a clean GeSn or SiGeSn surface can include positioning a substrate in a processing chamber, wherein the substrate includes an exposed GeSn or SiGeSn layer, adjusting the processing chamber to a first temperature, flowing an $NF_3$ and $NH_3$ plasma gas mixture into the processing chamber at the first temperature to form a salt mixture, wherein the salt mixture includes the surface contaminants, heating the substrate to a second temperature to sublimate the salt mixture, positioning the cleaned substrate in a deposition chamber wherein the vacuum is maintained, and depositing an overlayer on top of the cleaned surface, wherein the overlayer comprises one of either Ge, doped Ge, a GeSn layer, a SiGeSn layer, a doped GeSn layer, a doped SiGeSn layer, an insulator, or a metal.

The halide gas can include chlorine or hydrogen chloride. The dopant can include one or more of composed of one of either boron (B), phosphorus (P), or arsenic (As).

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Methods for preparing the surface of germanium tin (GeSn) or silicon germanium tin (SiGeSn) layers for subsequent deposition are provided. The methods are described in more detail with reference to the figures below.

Figure 1:
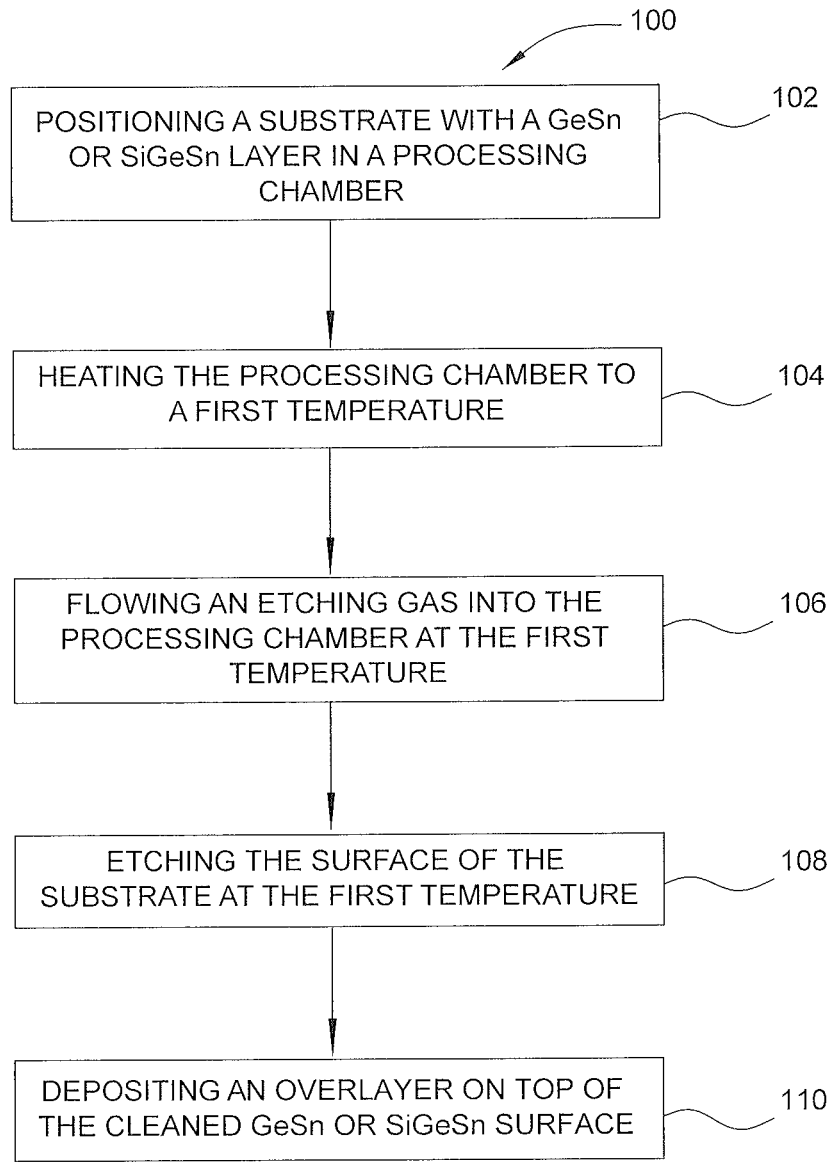
FIG. 1 is a flow diagram summarizing a method according to one embodiment.

FIG. 1 is a flow diagram summarizing a method 100 according to one embodiment. A semiconductor substrate is positioned in a processing chamber at step 102. The semiconductor substrate may be any semiconductive material on which a stressor layer or an overlayer of any other function is to be formed. A silicon or germanium substrate on which a GeSn or SiGeSn layer is formed may be used in one example. The semiconductor substrate may have regions of oxide or surface contaminants formed on the GeSn or SiGeSn layer, which may be created at transfer steps between a vacuum environment and an ambient environment. For example, oxide may be formed and surface contaminants may be accumulated during the transfer steps between formation of a source/drain region and removal of the masking prior to further deposition.

The processing chamber is heated to a first temperature at step 104. The first temperature can be from 300° C. to 400° C. which is chosen to prepare the GeSn or SiGeSn layer for subsequent steps. The temperature choice is dependent on a number of factors including the thickness of the layer and the amount of time that the layer will be at the chosen temperature.

The main problem expected with GeSn or SiGeSn layers and increased temperature is Sn segregation from the GeSn or SiGeSn lattice. A germanium crystal usually has a cubic structure with unit cell dimension about 566 pm. Each germanium atom has a radius of about 125 pm, which tin atoms have radius of about 145 pm. Adding the larger metal atoms to a germanium crystal matrix results in a larger lattice size that exerts a uniaxial compressive stress to lateral germanium atoms and/or biaxial tensile strain to overlying germanium atoms. Such strain increases the energy of local electrons and reduces the bandgap of the germanium, resulting in higher carrier mobility compared to unstrained germanium.

In one aspect, the silicon or germanium substrate may have a germanium channel layer adjacent to which the stressor layer is to be formed as part of a transistor gate structure. The GeSn or SiGeSn stressor in this case applies a uniaxial stress onto the neighboring germanium layer. In another aspect, the germanium channel layer is deposited over the stressor layer, so that a biaxial tensile strain is applied to the germanium channel layer. However, when the temperature is either too high or is held at a high temperature for too long, the tin can partially or completely segregated from the germanium crystal matrix reducing the stress benefits on the bandgap. As such, time spent at a particular temperature should be considered for all steps.

An etching gas is flowed into the processing chamber at the first temperature at step 106. The etching gas can be a halide gas. The halide gas can be a gas such as chlorine or hydrogen chloride. However, any halide gas is contemplated for the etching process. The choice of temperature above may also be affected by the choice of halide gas. An exemplary temperature for short etches to remove the surface oxide layer or contaminants with chlorine can be as low as 300° C. When using hydrogen chloride in one embodiment, etching temperatures can be as low as from 350° C. to 370° C. The etching gas can be flowed into the chamber at rates such as from about 10 sccm to about 300 sccm, such as from about 50 sccm to about 200 sccm, for example about 100 sccm. The etching gas may also be mixed with a carrier gas to achieve a desired space velocity and/or mixing performance in the processing chamber.

Once the etching gas is present in the chamber, the surface oxide or contaminants can be cleaned from the surface of the GeSn or SiGeSn layer at step 108. The etching process can be done using either a purely thermal etching or plasma assisted etching process. When using the plasma assisted process, etching temperatures can be lower than purely thermal etching processes. As can be expected, since the plasma can be performed at a lower temperature, the process can be done for a longer period of time before Sn segregation occurs.

An overlayer is deposited on the surface of a cleaned GeSn or SiGeSn layer at step 110. The overlayer can be composed of Ge, doped Ge, a GeSn layer, a SiGeSn layer, a doped GeSn layer, a doped SiGeSn layer, an insulator, or a metal. Insulators usable as overlayers includes a list of all known insulators usable in semiconductor applications, with exemplary embodiments including germanium oxide or silicon oxide. Metals usable in overlayers include a list of all known metals usable in semiconductor applications, with exemplary embodiments including nickel and platinum.

The overlayer can be deposited by any known technique in the art to deposit the described layers, such as chemical vapor deposition (CVD) or physical vapor deposition (PVD). In one or more embodiments, germanium oxide and silicon oxide can be deposited by a CVD process. In further embodiments, nickel or platinum can be deposited to form contacts by a PVD process. In one or more CVD processes, the precursors may be mixed with an inert gas, which may be a non-reactive gas such as nitrogen gas, hydrogen gas, or a noble gas such as helium or argon, or a combination thereof. The dopant that can be incorporated in the layer can include phosphorus, boron or arsenic.

In one embodiment, the overlayer can be a doped germanium layer which can be deposited by conventional CVD processes. The germanium precursor can be a germanium hydride, such as germane ($GeH_4$), or higher hydrides ($Ge_xH_{2x+2}$), or a combination thereof. The germanium precursor can be delivered with a dopant source gas. The dopant source gas can include diborane, phosphine, arsine or combinations thereof. Further, the dopant can be may be mixed with an inert gas, which may be a non-reactive gas such as nitrogen gas, hydrogen gas, or a noble gas such as helium or argon, or a combination thereof to achieve a desired space velocity and/or mixing performance in the processing chamber.

Figure 2:
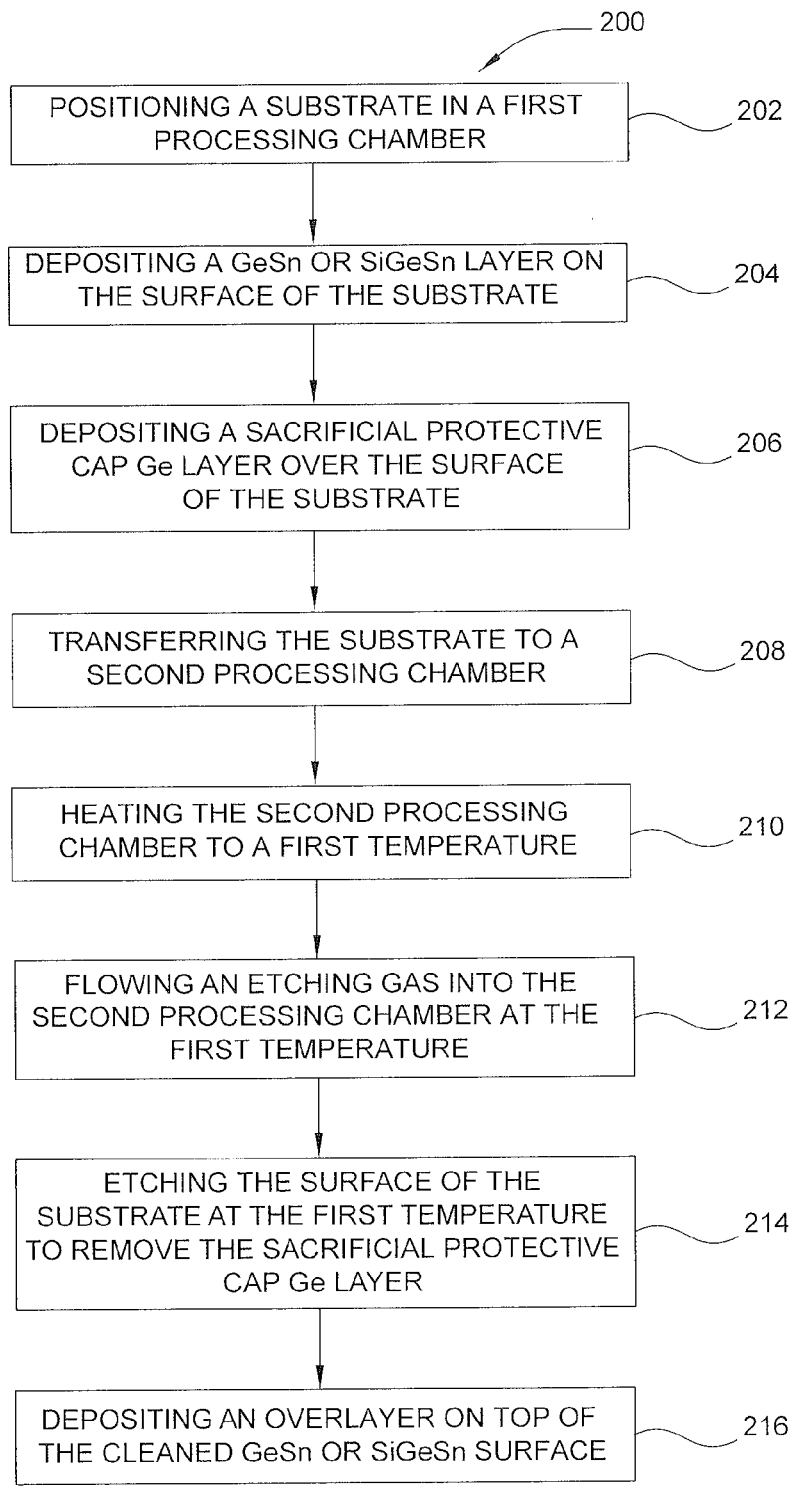
FIG. 2 is a flow diagram summarizing a method according to another embodiment.

FIG. 2 is a flow diagram summarizing a method 200 according to another embodiment. A semiconductor substrate is positioned in a first processing chamber at step 202. As previously discussed, the semiconductor substrate may be any semiconductive material on which a stressor layer is to be formed. A silicon or germanium substrate on which a GeSn or SiGeSn layer is formed may be used in one example.

A GeSn or SiGeSn layer may be formed on the surface of the substrate at step 204. The GeSn or SiGeSn layer may be formed by any known method in the art, such as MOCVD. At this point, the first processing chamber should remain sealed to prevent contamination of the GeSn or SiGeSn layer.

A sacrificial protective cap germanium layer can be deposited on the surface of the substrate at step 206. The germanium precursor is typically a germanium hydride, such as germane ($GeH_4$) digermane ($Ge_2H_6$), or higher hydrides ($Ge_xH_{2x+2}$), or a combination thereof. The germanium precursor may be mixed with an inert gas, which may be a non-reactive gas such as nitrogen gas, hydrogen gas, or a noble gas such as helium or argon, or a combination thereof. The ratio of germanium precursor volumetric flow rate to carrier gas flow rate may be used to control gas flow velocity through the chamber. The ratio may be any proportion from about 1% to about 99%, depending on the flow velocity desired.

The sacrificial protective cap germanium layer in step 206 should be deposited prior to the processing chamber seal being broken and prior to the wafer being transferred from the processing chamber. Further, it is deposited sequentially after the GeSn or SiGeSn layer is deposited within the same chamber. It is important that the GeSn or SiGeSn layer should be kept from exposure to oxygen or other possible contaminants, until the germanium layer is deposited over the surface of the GeSn or SiGeSn layer. The sacrificial protective cap germanium layer can act as a barrier allowing transfer of the substrate with the GeSn or SiGeSn layer between chambers or to allow opening of the current processing chamber without contamination of the surface of the GeSn or SiGeSn layer.

The sacrificial protective cap germanium layer in this step can be deposited over all exposed surfaces, such as over exposed silicon, germanium, the GeSn or SiGeSn layer or photoresists. The sacrificial protective cap germanium layer is used as a protective coating over the GeSn or SiGeSn layer, prior to transfer from the processing chamber. The sacrificial protective cap germanium layer can be relatively thin. In some embodiments, the germanium layer can be from 20 Å-100 Å thick, such as 20 Å-40 Å thick with preferred embodiments of 20 Å thick.

The sacrificial protective cap germanium layer can be deposited by a CVD process using precursors listed above. Growth of the germanium layer is generally epitaxial for high structural quality. Pressure in the processing chamber can be maintained between about 20 Torr and about 200 Torr, such as between about 20 Torr and about 80 Torr, for example about 40 Torr. Temperature is between about 150° C. and about 500° C., such as between about 300° C. and about 450° C., for example about 300° C. Pressures may be below about 20 Torr in some embodiments, but reduced pressure also reduces deposition rate. Deposition rate at these conditions is between about 50 Å/min and about 500 Å/min.

The substrate can be transferred to a second processing chamber in step 208. The germanium layer deposited over the GeSn or SiGeSn layer in the previous step will be oxidized and contaminated during the transfer but it will prevent oxidation or other contamination of the GeSn or SiGeSn layer.

The second processing chamber is heated to a first temperature at step 210. The first temperature can be from 300° C. to 400° C. which is chosen to prepare the GeSn or SiGeSn layer for subsequent steps. The temperature choice is dependent on similar factors, such as thickness and time, as described in more detail above.

An etching gas is flowed into the second processing chamber at the first temperature at step 212. The etching gas can be a halide gas. The halide gas can be a gas such as chlorine or hydrogen chloride. However, any halide gas is contemplated for the etching process. The choice of temperature above may also be affected by the choice of halide gas. A known temperature for short etches to remove the surface oxide layer or contaminants with chlorine is as low as 300° C. When using hydrogen chloride in one embodiment, etching temperatures can be as low as from 350° C. to 370° C. The etching gas can be flowed into the chamber at rates such as from about 10 sccm to about 300 sccm, such as from about 50 sccm to about 200 sccm, for example about 100 sccm. The etching gas may also be mixed with a carrier gas to achieve a desired space velocity and/or mixing performance in the processing chamber.

Once the etching gas is present in the chamber, the sacrificial protective cap germanium layer can be etched from the surface of the GeSn or SiGeSn layer at step 214. The etching process can be done using either a purely thermal etching or plasma assisted etching process. When using the plasma assisted process, etching temperatures can be lower than purely thermal etching processes. As can be expected, since the plasma can be performed at a lower temperature, the process can be done for a longer period of time before tin segregation from GeSn or SiGeSn occurs. In this embodiment, only the sacrificial protective cap germanium layer was exposed to atmospheric conditions after the previous processing steps, which prevents oxide formation or contamination on the GeSn or SiGeSn layer. Thus, by removing the sacrificial protective cap germanium layer, the newly exposed GeSn or SiGeSn layer is substantially oxide free and contaminant free, and ready for deposition in subsequent steps.

An overlayer is deposited on the surface of a cleaned GeSn or SiGeSn layer at step 216. As stated previously, the overlayer can be composed of Ge, doped Ge, a GeSn layer, a SiGeSn layer, a doped GeSn layer, a doped SiGeSn layer, an insulator, or a metal. The overlayer may be deposited by any technique known in the art for deposition of such layers, such as CVD or PVD. Other parameters and exemplary embodiments for overlayer deposition, as described with reference to FIG. 1, are applicable here as well. For sake of brevity, they are incorporated herein by reference.

Figure 3:
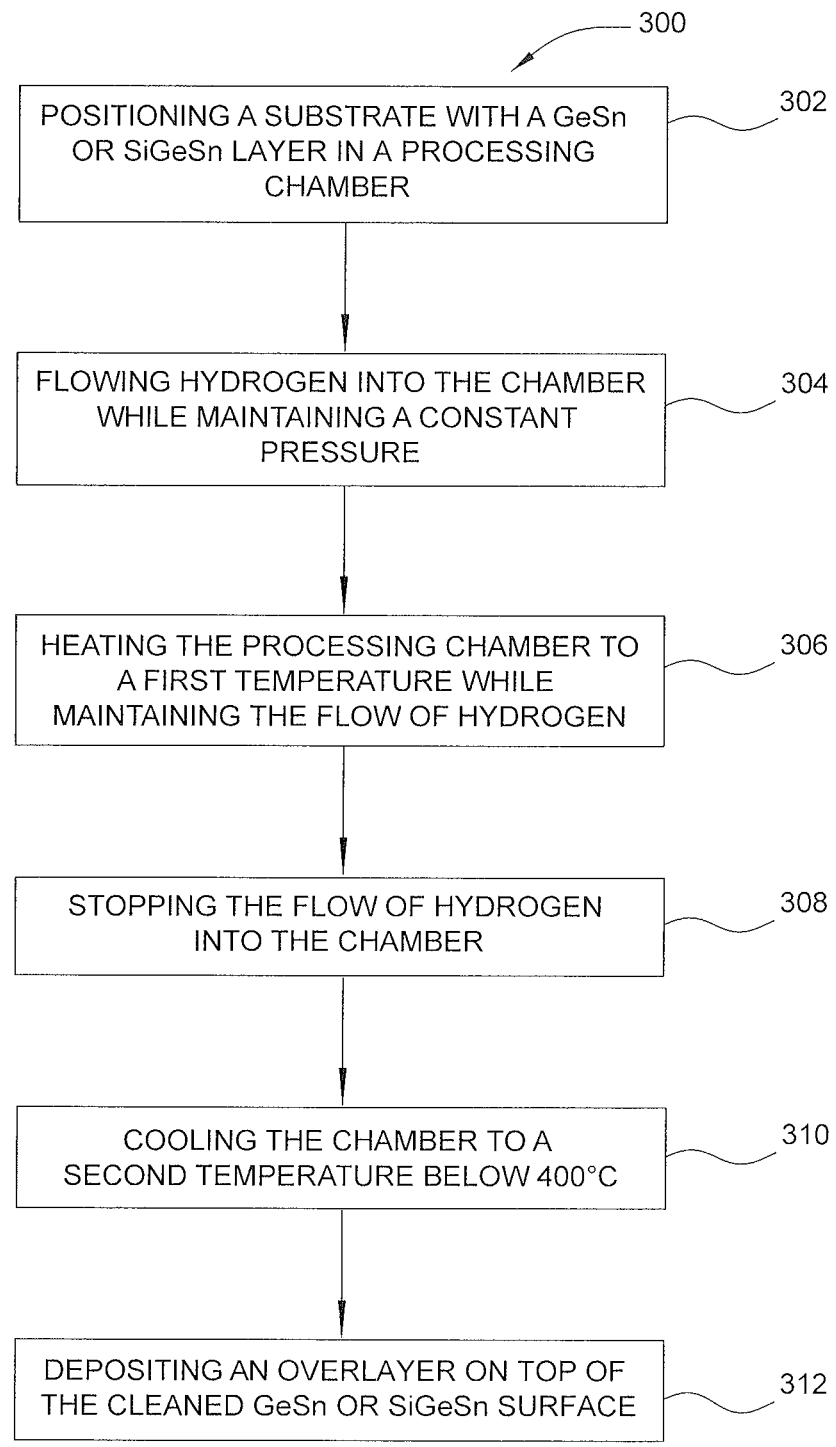
FIG. 3 is a flow diagram summarizing a method according to a further embodiment.

FIG. 3 is a flow diagram summarizing a method 300 according to another embodiment. A semiconductor substrate is positioned in a rapid thermal processing chamber at step 302. As previously discussed, the semiconductor substrate may be any semiconductive material on which a stressor layer or a layer of any other function is to be formed. A silicon or germanium substrate on which a GeSn or SiGeSn layer is formed may be used in one example.

$H_2$ can be flowed into the processing chamber at step 304. The flow of $H_2$ can be maintained at a constant pressure. In one or more embodiments, the pressure can be maintained from 20 torr to 200 torr.

The chamber can be heated to a first temperature while maintaining the $H_2$ flow at step 306. The chamber is heated to a temperature greater than 400° C. High temperatures can lead to thermal desorption of the surface oxide layer or contaminants on the exposed GeSn or SiGeSn surface. As before, consideration must be given to prevent Sn segregation of the GeSn or SiGeSn layer during heating processes. The thermal stability of the GeSn or SiGeSn layer is controlled by a number of factors including thickness of the layer, the final temperature, the time in the presence of a specific temperature and the atmosphere. One embodiment of the GeSn or SiGeSn layer can be expected to remain stable at 500° C. for 15 minutes.

A constant $H_2$ flow can increase the thermal desorption of the surface oxide and/or contaminants in the presence of high temperatures. Without intending to be bound by theory, a constant flow of $H_2$ can enhance the removal of surface oxides by at least two mechanisms. In one aspect, $H_2$ can react with surface oxides to form volatile species, which can then be removed from the chamber. In another aspect, thermal desorption can be assisted by purging the atmosphere of previously desorbed oxide or contaminant species, thereby decreasing the partial pressure of oxide or contaminant species.

In one or more embodiments of this method, thermal processing can be assisted by the use of UV source, such as a flash lamp. Typical conventional bulbs in an RTP reactor produce a broad wavelength light. The long wavelength of this light is indicative of the low energy produced. By using a UV source, the oxide can be desorbed from the surface of the GeSn or SiGeSn layer at a lower temperature or over a shorter time frame than a rapid thermal anneal processing alone.

Once the GeSn or SiGeSn layer is substantially free of oxide and contaminants, the flow of $H_2$ into the atmosphere can be stopped at step 308. The GeSn or SiGeSn layer is expected to experience some loss after thermal desorption. Further there is some overlap between techniques here, considering that a thin germanium layer, less than 20 Å, could be removed by the thermal processing at high temperatures, such as temperatures above 450° C.

After the $H_2$ flow is stopped, the temperature can be cooled below 400° C. at step 310. The temperatures used in rapid thermal anneal processes can be higher than the maximum temperatures listed because they are for such a short time period. As such, the temperature should be lowered as soon after the oxide or contaminant species has desorbed as possible to prevent segregation of the tin from the GeSn or SiGeSn crystal lattice.

An overlayer is deposited on the surface of a cleaned GeSn or SiGeSn layer at step 312. As stated previously, the overlayer can be composed of Ge, doped Ge, a GeSn layer, a SiGeSn layer, a doped GeSn layer, a doped SiGeSn layer, an insulator, or a metal. The overlayer may be deposited by any technique known in the art for deposition of such layers, such as CVD or PVD. Other parameters and exemplary embodiments for overlayer deposition, as described with reference to FIG. 1, are applicable here as well. For sake of brevity, they are incorporated herein by reference.

Figure 4:
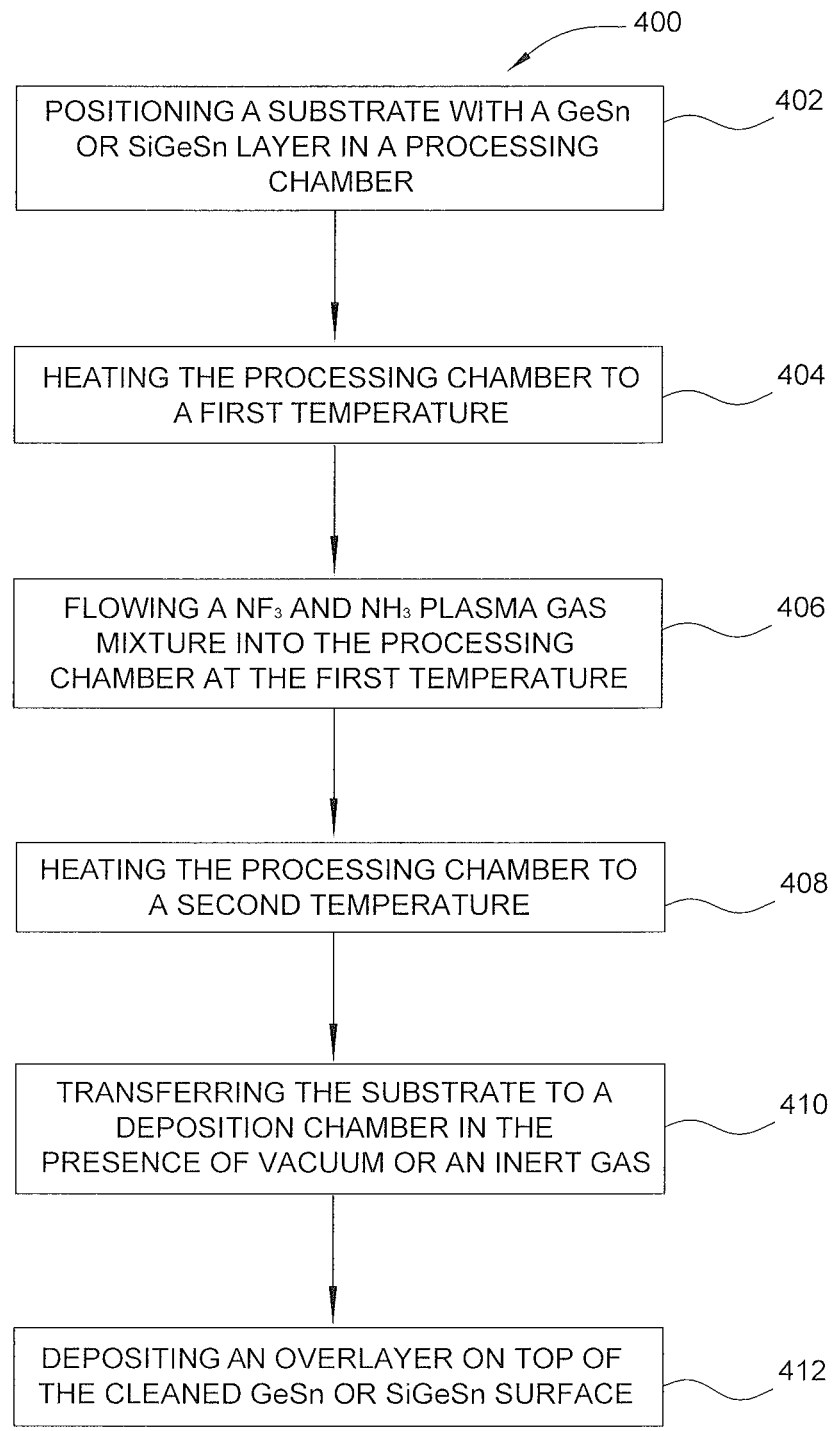
FIG. 4 is a flow diagram summarizing a method according to a further embodiment.

FIG. 4 is a flow diagram summarizing a method 400 according to another embodiment. A semiconductor substrate is positioned in a processing chamber at step 402. The processing chamber can be an integrated dry clean chamber, such as a SiCoNi chamber available from Applied Materials, Inc, of Santa Clara, Calif. As previously discussed, the semiconductor substrate may be any semiconductive material on which a stressor layer or a layer of any other function is to be formed. A silicon or germanium substrate on which a GeSn or SiGeSn layer is formed may be used in one example.

The processing chamber is heated to a first temperature at step 404. The first temperature can be below 65° C., with preferred embodiments of from 20° C. to 60° C.

The ammonia and nitrogen trifluoride gases are then introduced into the chamber to form a plasma gas mixture at the first temperature at step 406. The gases should be introduced under vacuum, as vacuum will be beneficial to remove volatile components created during the cleaning process. The amount of each gas introduced into the chamber is variable and may be adjusted to accommodate, for example, the thickness of the oxide layer to be removed, the geometry of the substrate being cleaned, the volume capacity of the plasma, the volume capacity of the processing chamber, as well as the capabilities of the vacuum system coupled to the processing chamber. In one or more embodiments, the gases are added to provide a gas mixture having at least a 1:1 molar ratio of ammonia to nitrogen trifluoride. In another aspect, the molar ratio of the gas mixture is at least about 3:1 molar ratio (ammonia to nitrogen trifluoride). Preferably, the gases are introduced in the chamber at a molar ratio of from 5:1 (ammonia to nitrogen trifluoride) to 30:1.

The gas mixture can then be converted inside the processing chamber to a plasma using a DC or RF power source. Exemplary embodiments include using an RF power source to provide an RF power of from about 5 Watts to about 600 Watts to ignite the gas mixture creating a plasma. Preferable embodiments include using an RF power of less than 100 Watts. The plasma energy dissociates the ammonia and nitrogen trifluoride gases into reactive species that combine to form a highly reactive ammonia fluoride ($NH_4F$) compound and/or ammonium hydrogen fluoride ($NH_4F \cdot HF$) in the gas phase. $NH_4F$ and $NH_4F \cdot HF$ are believed to react with the silicon oxide to form ammonium hexafluorosilicate $(NH_4)_2SiF_6$, $SiF_6$, $NH_3$, and $H_2O$; and the germanium oxide to form ammonium hexafluorogermanate $(NH_4)_2GeF_6$, $GeF_6$, $NH_3$, and $H_2O$. The $NH_3$ and $H_2O$ are gaseous at reaction temperatures and pressures and are removed from the processing chamber leaving a thin film of $(NH_4)_2SiF_6$ remaining on the oxide free surface of the GeSn or SiGeSn layer.

The processing chamber can then be heated to a second temperature at step 408. The second temperature can be a temperature of greater than 80° C., with preferred embodiments of from 80° C. to 150° C. At temperature higher than 80° C., the thin film of $(NH_4)_2SiF_6$ or $(NH_4)_2GeF_6$ can dissociate or sublimate into volatile $SiF_4$, $NH_3$ and HF products. After the volatile components are made gaseous, they can be removed from the chamber leaving only the cleaned surface.

The substrate with the cleaned GeSn or SiGeSn surface can be transferred into a deposition chamber in the presence of vacuum or an inert gas in step 410. The inert gas can be selected from a list of all inert gases, including nitrogen, argon, helium. The environment in the chamber can be maintained to assure that no further surface contaminants accumulate during the transfer. The deposition chamber can be any chamber which can be used to deposit one of the overlayers previously described.

An overlayer is deposited on the surface of a cleaned GeSn or SiGeSn layer at step 412. As stated previously, the overlayer can be composed of Ge, doped Ge, a GeSn layer, a SiGeSn layer, a doped GeSn layer, a doped SiGeSn layer, an insulator, or a metal. The overlayer may be deposited by any technique known in the art for deposition of such layers, such as CVD or PVD. Other parameters and exemplary embodiments for overlayer deposition, as described with reference to FIG. 1, are applicable here as well. For sake of brevity, they are incorporated herein by reference.

Methods of preparing a clean surface of GeSn or SiGeSn layers for subsequent deposition are provided. An overlayer of Ge, doped Ge, another GeSn or SiGeSn layer, a doped GeSn or SiGeSn layer, an insulator, or a metal can be deposited on a prepared GeSn or SiGeSn layer by positioning a substrate with an exposed GeSn or SiGeSn layer in a processing chamber, heating the processing chamber and flowing a halide gas into the processing chamber to etch the surface of the substrate using either thermal or plasma assisted etching followed by depositing an overlayer on the substantially oxide free and contaminant free surface. In other embodiments, a method of preparing a clean surface of a GeSn or SiGeSn layer can also include the placement and etching of a sacrificial layer with a subsequent deposition of the overlayer. In further embodiments, the method of preparing a clean surface of a GeSn or SiGeSn layer can also include a thermal desorption using rapid thermal annealing. In still further embodiments, the method of preparing a clean surface of a GeSn or SiGeSn layer can also include flowing an $NF_3$ and $NH_3$ plasma gas mixture into the processing chamber form a salt mixture that includes the surface oxide and contaminants, and sublimating the salt. Removing the surface oxides and contaminants ensures the film quality of subsequently deposited layers and the quality of interface between the overlayer and the GeSn or SiGeSn layer. Thereby, this pre-deposition processing leads to lower product loss is subsequent processing.

While the foregoing is directed to embodiments of the invention, other and further embodiments of the invention may be devised without departing from the basic scope thereof.

What is claimed is:

1. A method of preparing a surface, comprising:
    heating a substrate in a processing chamber to a first temperature, the substrate comprising a layer comprising Ge and Sn;
    removing contaminants from a surface of the layer comprising Ge and Sn using an etching gas, the etching gas comprising a halide gas; and
    depositing a second layer on the surface of the layer comprising Ge and Sn.

2. The method of claim 1, wherein the etching gas is delivered to the layer comprising Ge and Sn at a temperature greater than 300° C.

3. The method of claim 1, wherein the first temperature is from 300° C. to 400° C.

4. The method of claim 1, wherein the second layer further comprises a dopant.

5. The method of claim 4, wherein the dopant comprises phosphorus (P), boron (B), or arsenic (As).

6. The method of claim 1, wherein the second layer comprises Ge, doped Ge, GeSn, SiGeSn, doped GeSn, or doped SiGeSn.

7. The method of claim 1, wherein the halide gas is either chlorine ($Cl_2$) or hydrogen chloride (HCl).

8. A method of preparing a surface, comprising:
    heating a substrate in a processing chamber to a first temperature, the substrate comprising a layer comprising Ge and Sn;
    removing contaminants from a surface of the layer comprising Ge and Sn using an etching gas, the etching gas comprising a halide gas wherein the etching gas is delivered to the layer comprising Ge and Sn at a temperature greater than 300° C.; and
    depositing a second layer on the surface of the layer comprising Ge and Sn.

9. The method of claim 8, wherein the first temperature is from 300° C. to 400° C.

10. The method of claim 8, wherein the second layer further comprises a dopant.

11. The method of claim 10, wherein the dopant comprises phosphorus (P), boron (B), or arsenic (As).

12. The method of claim 8, wherein the second layer comprises Ge, doped Ge, GeSn, SiGeSn, doped GeSn, or doped SiGeSn.

13. The method of claim 8, wherein the halide gas is either chlorine ($Cl_2$) or hydrogen chloride (HCl)

* * * * *